United States Patent
Liu et al.

(10) Patent No.: US 7,482,555 B2
(45) Date of Patent: Jan. 27, 2009

(54) SUBSTRATE TRANSPORTATION DEVICE (AIR)

(75) Inventors: Shiang-Chiang Liu, Taipei (TW); Tsung-Lin Lu, Dongshan Township, Tainan County (TW); Ying-Chi Chen, Taoyuan (TW)

(73) Assignee: Au Optronics Corporation, Hsin-Chu (TW)

( * ) Notice: Subject to any disclaimer, the term of this patent is extended or adjusted under 35 U.S.C. 154(b) by 859 days.

(21) Appl. No.: 11/019,389

(22) Filed: Dec. 23, 2004

(65) Prior Publication Data

US 2006/0137544 A1   Jun. 29, 2006

(51) Int. Cl.
*F27B 5/14* (2006.01)
*B65G 1/00* (2006.01)

(52) U.S. Cl. .................. 219/390; 219/405; 219/411; 414/936; 414/935; 414/938; 414/940; 414/941

(58) Field of Classification Search ......... 414/935–941, 414/331.11
See application file for complete search history.

(56) References Cited

U.S. PATENT DOCUMENTS 6,940,047 B2 * 9/2005 van Kesteren et al. ....... 219/390

FOREIGN PATENT DOCUMENTS

| JP | 2000-168955 | 6/2000 |
|----|-------------|--------|
| JP | 2004-277003 | 10/2004 |

* cited by examiner

*Primary Examiner*—Shawntina Fuqua
(74) *Attorney, Agent, or Firm*—Arent Fox LLP

(57) ABSTRACT

A substrate transportation device includes a housing for transporting substrates. The housing is formed of an upper surface, a lower surface, and opposing sidewalls. The housing has a rear opening through which the substrates enter the housing and a front opening through which the substrates exit the housing. A plurality of hollow supporting members are disposed within the housing and affixed to the opposing sidewalls which are formed by a plurality of columns. The hollow supporting members have a plurality of apertures in an upper surface for supplying a medium to a lower surface of the plurality of substrates. A medium supply member transfers the medium toward the hollow supporting member. The medium transferred by the medium supply member is delivered through the apertures in the upper surface of the plurality of hollow supporting members to float the substrates on a cushion of air.

25 Claims, 5 Drawing Sheets

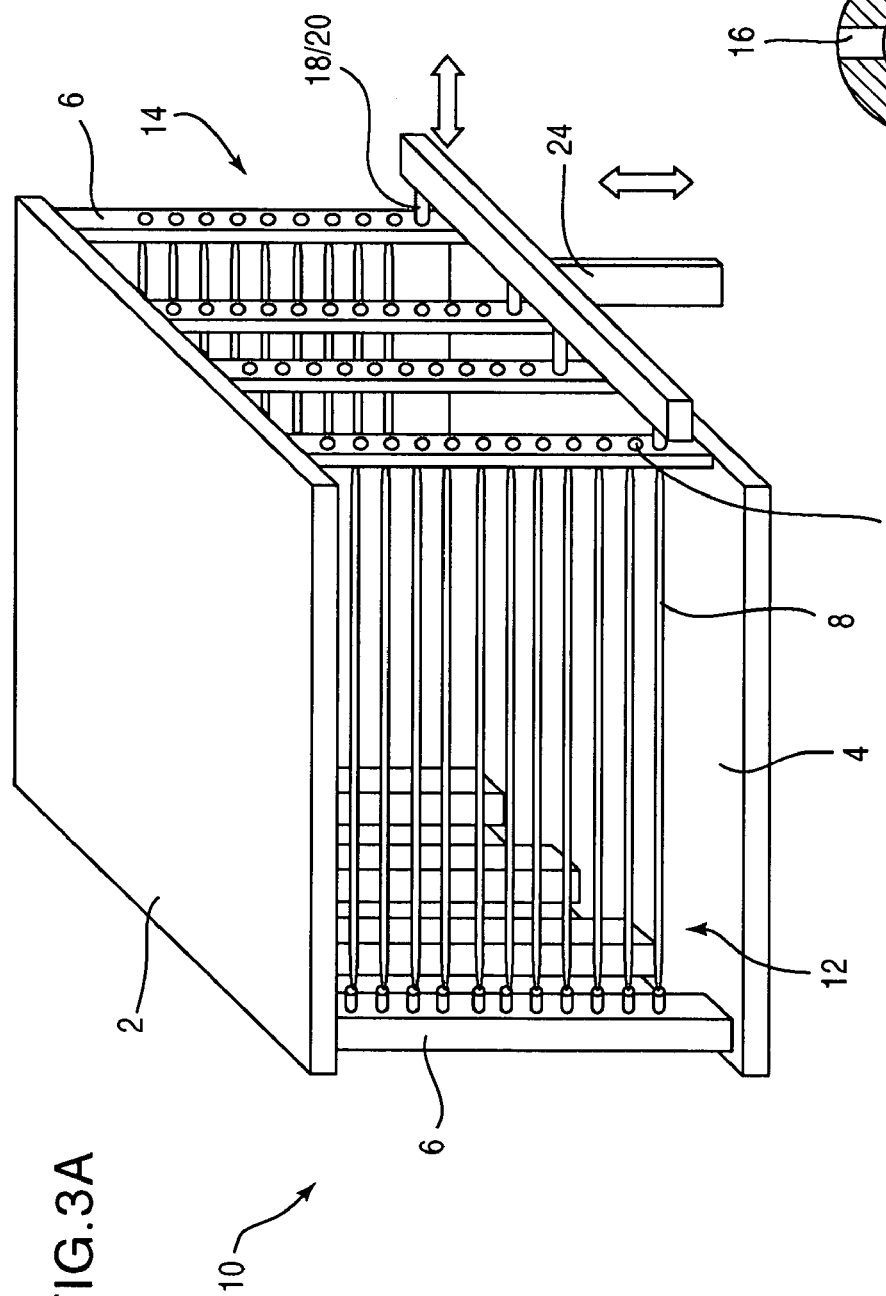
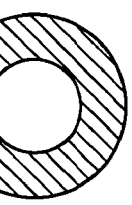
FIG.3A
FIG.3B

SUBSTRATE TRANSPORTATION DEVICE (AIR)

BACKGROUND OF THE INVENTION

1. Field of the Invention

This invention relates to a substrate transportation device. More specifically, the present invention relates to a substrate transportation device for transporting a material, for example, a glass tray from one location to another, and providing sufficient support for the entire body of the tray, and thereby improving the transportation of the substrate in an efficient and timely manner.

2. Description of the Related Art

Automation and robotics are used in substrate transportation to improve the efficiency of transportation, and serve to reduce human contamination of the glass tray, used in the contamination-sensitive thin film transistor liquid crystal displays (TFT-LCD). Such a glass tray is manufactured in cleanroom environments.

When a large glass tray is placed in a housing by a robotic apparatus, the tray must be supported underneath. This is often accomplished by a grid structure. As shown in FIG. 1, the grid structure is formed by rows of horizontally disposed pairs of supporting grids 80 that extend toward the center of the housing 10 from the inner walls of the housing. The grids 80 are vertically spaced to allow a glass tray 22 to be supported by each pair of grids. One of the purposes of having the grid structure only partially extending across the housing is to minimize contact with the surface of the glass tray and thereby reduce contamination. However, the arrangement of the existing grids in current housings causes the glass trays to droop or sag in the middle, because there is no support for the middle of the glass tray. Sagging of the glass trays causes the trays to become undesirably bent. Further, the sagging of the glass trays causes the trays to have a vertically concave cross section, resulting in glass trays that occupy a vertical space that is greater than the thickness of the glass tray. See FIG. 1. As such, fewer glass trays can be transported through the housing.

In order to increase the number of glass trays that can be supported as well as transported through the housing, another type of supporting system was developed. FIG. 2 illustrates supporting lines 82 for supporting the glass trays 22. The supporting lines 82 are shown as having end portions that are fastened to the inner walls of the housing 10 and span the width of the housing. Although each supporting line 82 supports the entire body of the glass tray, the weight of the tray causes the supporting line, and therefore the tray, to sag in the middle. Further, the supporting lines are arranged so close together that a robotic device cannot access, and thereby transport, the trays to and from the housing. In this arrangement, the glass trays must be transported by an axle system underneath each glass tray, which can only dispense the trays one by one.

Therefore, there is a need for an improved device and method for transporting a substrate that minimizes contact with the housing, but supports both the ends and the middle of the substrate.

SUMMARY OF THE INVENTION

The present invention relates to a transportation device for storing, supporting and transporting a substrate such as a glass tray during manufacture, so that the substrate does not bend or come in contact with the tray housing of the transportation device. Glass trays include, for example, thin film transistor liquid crystal display panels (TFT-LCD), which are used in applications ranging from mobile telephones to computer monitor screens to flat panel televisions. During the manufacture and transport of the trays, contact with any part of the tray housing such as rollers or sidewalls, can result in either physical damage to the glass tray or contamination of the tray, making it unsuitable for use. Among other things, the substrate transportation device of the present invention provides an air cushion to support the glass tray while in the housing, thereby eliminating contact of the glass tray with the housing and housing supporting members. A fluid medium, such as, for example, air, is continuously forced under the tray, generating a cushion between the tray and the housing supporting members that greatly reduces friction between the tray and the supporting members. Further, the air cushion of the substrate transportation device of the present invention reduces contamination of the glass tray by eliminating contact with the supporting members of the housing. Glass trays are used as an example, however, present invention is not limited to transporting glass trays, and any kind of substrate can benefit from the transportation device of the present invention.

The air cushion across the entire lower surface of the substrate also supports the middle of the tray. As a result, the tray remains substantially planar in that the sagging or bending of the tray is eliminated. The present invention also allows for an increased number of substrates to be stacked in a housing because The present invention also provides ease of access for the robot or automated device to transport the substrate into and out from the housing with minimal force. As such, the robot or automated device can easily access each tray as necessary to remove it from the housing.

The substrate transportation device includes a housing for storing supporting and transporting the substrates. The housing is sized to accommodate a plurality of substrates of varying dimensions. The housing includes a frame having an upper surface, a lower surface, and a set of opposing sidewalls. The sidewalls can be formed of a plurality of parallel arrayed columns extending from the upper surface of the housing to the lower surface. Each column supports a plurality of uniformly spaced supporting members.

The supporting members are hollow and conduct a medium, such as air, supplied by a blower with a fan and a driving motor, a compressor, or other source of air into the housing. The supporting members include a plurality of apertures through upper surfaces thereof so that jets of the medium can be exhausted through the upper surfaces of the supporting members. The supporting members conduct air from the supply to the upper surface of the supporting members thereby supporting the substrate in the housing on a cushion of air created between the supporting member and the substrate. As such, contact between the substrate and the supporting members can be significantly reduced. The substrate can be disposed substantially horizontally in the housing on the cushion of air, until transported by the robotic or automated device. When the substrate is supported on the cushion of air, it is easier for the tray to be transported, and only a minimal force is required to discharge the tray from the housing.

In one embodiment of the present invention, the supporting members can be arranged in the same horizontal plane from a front to rear direction of the housing. In this arrangement, a motor, metallic reed, air or other force can be applied to a rear end portion of the substrate in order to discharge the substrate from the housing.

In a second embodiment of the present invention, the supporting members can be arranged in different horizontal planes to form a slight incline from a front to a rear direction of the housing. In this embodiment, each of the supporting members toward the rear of the housing is arranged successively higher than its corresponding supporting members toward the front of the housing. Thus, the substrate is supported at an incline toward the front of the housing, making it even easier to discharge or push the substrate out of the housing. As such, a light force of air applied to the rear end portion of a substrate can discharge the tray from the housing through the front of the housing.

As a result of the present invention, the housing can accommodate more substrate while maintaining the efficient use of the robotic or other automated device for moving the substrate into and out from the housing, thereby greatly reducing friction and contamination of the substrate.

Additional advantages and novel features of the invention are set forth in the attachments to this summary, and in part will become more apparent to those skilled in the art upon examination of the following or upon learning by practice of the invention.

BRIEF DESCRIPTION OF THE DRAWINGS

The features of the invention will be more readily understood with reference to the following description and the attached drawings, wherein:

FIG. 3A illustrates a perspective view of an example substrate transportation device in accordance with a first embodiment of the present invention;

FIG. 3B illustrates a cross-sectional view of the supporting member of the present invention;

DETAILED DESCRIPTION OF THE INVENTION

The present invention is directed to a substrate transportation device for transporting and supporting such as, for example glass tray during manufacture. A glass tray can include a thin film transistor liquid crystal display panel.

Figure 1:
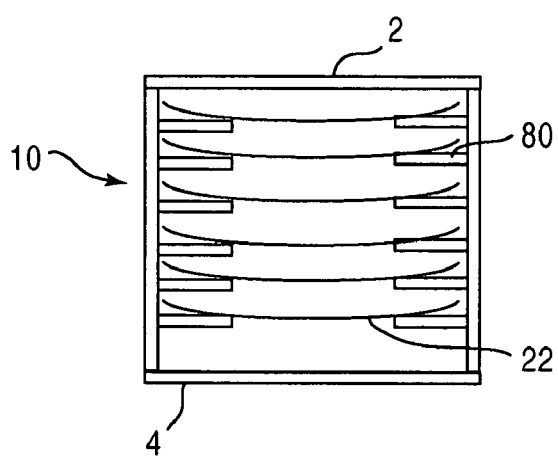
FIG. 1 illustrates a front view of one conventional substrate supporting device.
Figure 2:
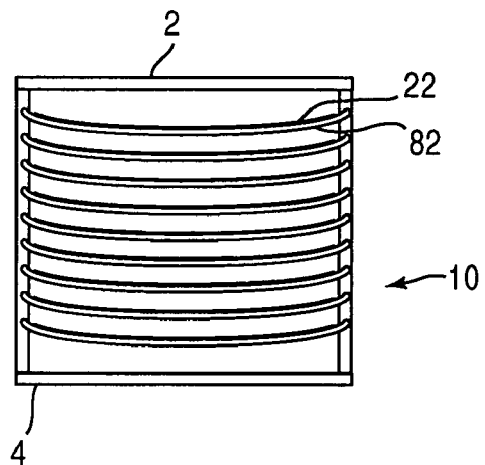
FIG. 2 illustrates a front view of another conventional substrate supporting device.
Figure 4:
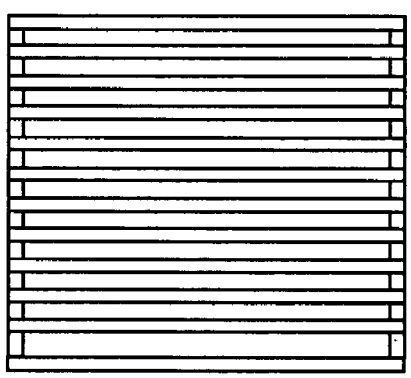
FIG. 4 illustrates a front view of an example substrate transportation device in accordance with a first embodiment of the present invention.
Figure 5:
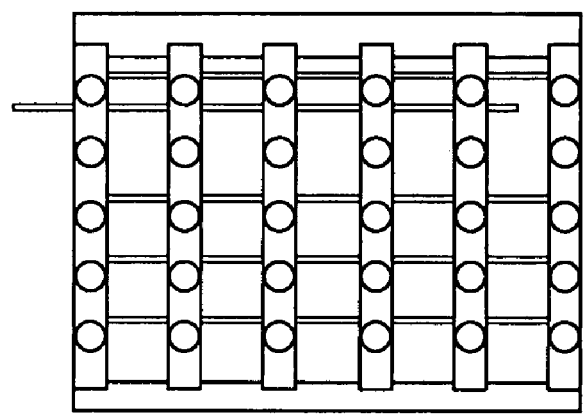
FIG. 5 illustrates a side view of an example substrate transportation device in accordance with the first embodiment of the present invention.
Figure 6:
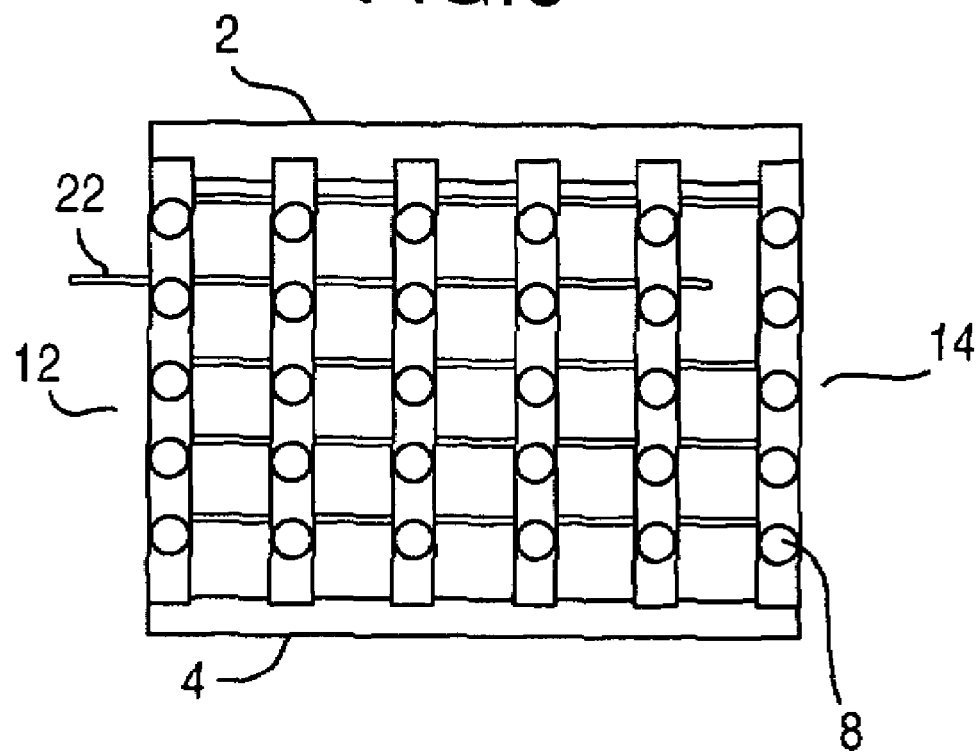
FIG. 6 illustrates a cross-sectional view of an example substrate transportation device in accordance with a second embodiment of the present invention.
Figure 7:
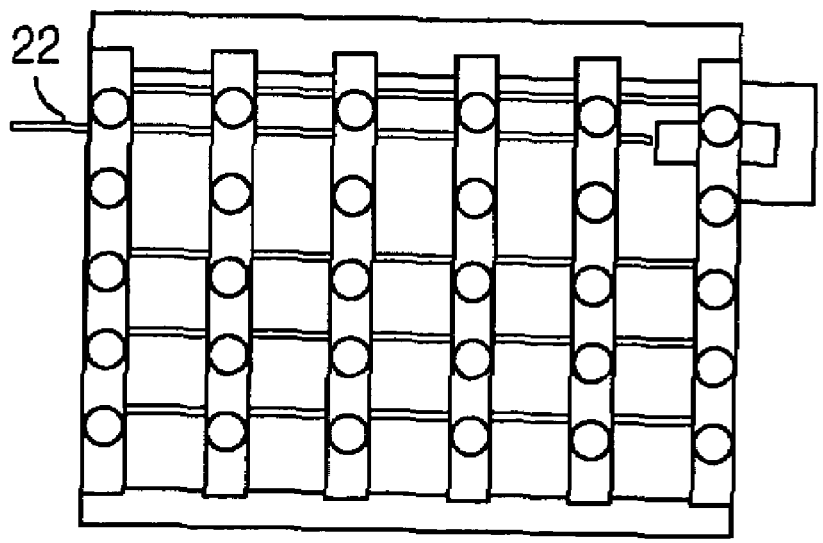
FIG. 7 illustrates a cross-sectional view of an example substrate transportation device with a discharging member.

As shown in FIGS. 4 and 5, the substrate transportation device includes a housing 10 for transporting a substrate 22. The housing 10 includes an upper surface 2, a lower surface 4, and opposing sidewalls 6 which can be formed as a plurality of columns. There is a rear opening 14 through which the substrate enters the housing and a front opening 12 through which the substrate exits the housing. The housing is illustrated in the Figures as having a square shape, however, the housing can be any other appropriate shape. The housing and sidewalls can be made of any material including, but not limited to, a metal tube, engineering plastic, or fiber-reinforced plastic.

Supporting members 8 shown in FIG. 3A, extend horizontally between the opposing sidewalls of the housing across the entire width of the housing 10, where they are anchored at both ends to the inner surfaces of the sidewalls 6. The supporting members are hollow so that they can receive a medium blown therein from a medium supply member such as, for example, a compressor 18 or a blower 20 as shown in FIG. 3A. The supporting members 8 also include a plurality of fine holes 16 to allow jets of the medium to be exhausted from the supporting member and serve as the host of floating air.

The jets of air are continuously forced through the apertures in the supporting member and create a cushion between the supporting members and the substrate 22 that greatly reduces friction between the tray and the supporting members 8. Although the supporting members are illustrated as tubular, the supporting members can have any overall shape that allows the entrance and exit of a fluid medium. The supporting member can be made from any material including, but not limited to a metal tube, engineering plastic or fiber reinforced plastic tube.

As illustrated in FIG. 3A, air is blown into the air receiving holes 26 in the sidewalls 6 from a blower 18 or compressor 20. The sidewalls 6 have a plurality of air receiving holes 26 for receiving air from the blower 18 or compressor 20. The air receiving holes 26 in the sidewalls 6 are aligned with the inlets of the supporting members 8, allowing the air to be conducted directly from the blower or compressor into the supporting members 8.

The air is exhausted from the apertures 16 in the supporting members 8 at pressures greater than ambient pressure. The air transferred by the blower or compressor is delivered through the apertures 16 in the upper surface of supporting members 8 to cushion the substrate 22. Specifically, the substrate 22 is disposed above the upper surface of the supporting members 8 and receives the exhausted air on a lower surface, which causes the substrate to be suspended above the supporting members on the cushion of air. The substrate can be suspended a predetermined distance above the supporting members based on the pressure of the air exhausted through the apertures 16. The predetermined distance is controlled by the air flow rate, outlet hole, and air pressure. A control unit adjusts the air flow rate. When air supports the substrate, the tray is easier to transport through the housing. The supporting members 8 are arranged such that at least two supporting members support a single tray of glass 22.

As shown in FIGS. 3-7, the sidewalls 6 can be formed as a plurality of columns. The columns have an inner surface that faces the inner surface of an opposing column and an outer surface that faces away from the opposing column. In a first embodiment of the present invention, the air receiving holes 26 are uniformly spaced in a vertical direction along the length of the column.

In a second embodiment of the present invention, the air receiving holes 26 in the sidewalls and the adjacent supporting members 8 are arranged differently. The air receiving holes 26 and the supporting members 8 are higher at a rear opening of the housing than at the front opening of the housing. This allows the substrate supported on the air to be slightly inclined in the direction of the front opening or exit of the housing. As such, the arrangement of the second embodiment of the present invention allows transport of the substrate from the housing to be more easily accomplished.

By transporting a substrate upon a cushion of air, damage to the substrate by contact with a moving surface can be significantly reduced. Further a minimal force on the substrate can push the tray out of the housing. Other ways of moving a substrate through the housing can include a small motor, metallic reed or a minimal force of air.

The medium supply member provides the air or fluid medium used to create a space between the hollow supporting members and the substrate and thereby cushion the substrate. The medium supply member includes a multi-fingered member 24 that is selectively moveable in the horizontal and vertical directions. As shown in FIG. 3A, the medium supply member is mounted to the multi-fingered member. Air from the medium supply member is conducted through the multi-fingered member 24 to the air receiving holes of the sidewalls 6. The multi-fingered member 24 selectively moves to the supply air to the supporting members where the substrate will be arranged. As such, the multi-fingered member 24 can move vertically along the outer surface of the sidewall to reach the uppermost, middle and lowermost supporting members that are supporting the substrate. The multi-fingered member 24 also moves horizontally to disengage itself from the sidewall so that it can freely move in the vertical direction to a different row of supporting members.

FIG. 3B illustrates a cross-section of the supporting member 8. Although the supporting member is shown as tubular, the supporting member can have any cross sectional shape. The supporting member includes an aperture 16 through the one surface. In operation, the aperture is arranged to point in an upward direction so that when the substrate is inserted into the housing to be supported by the supporting member, air through the aperture can strike a lower surface of the substrate creating a space between the substrate and the supporting member, thereby cushioning the substrate.

The present invention also includes a method of transporting a substrate into and out of a housing. In order for the substrate 22 to be transported through the housing with a reduction in friction and without damage or contamination, a medium is injected into the hollow supporting members 8. The medium, for example, compressed air at a pressure higher than ambient pressure exits the apertures 16 of the supporting member 8 striking the lower surface of the substrate 22. As such, when the substrate 22 enters the housing through the rear opening 14, the tray is supported on the cushion of air exhausted from the apertures 16. The force of the air continues until the substrate exits the housing through the front opening 12.

Figure 8:
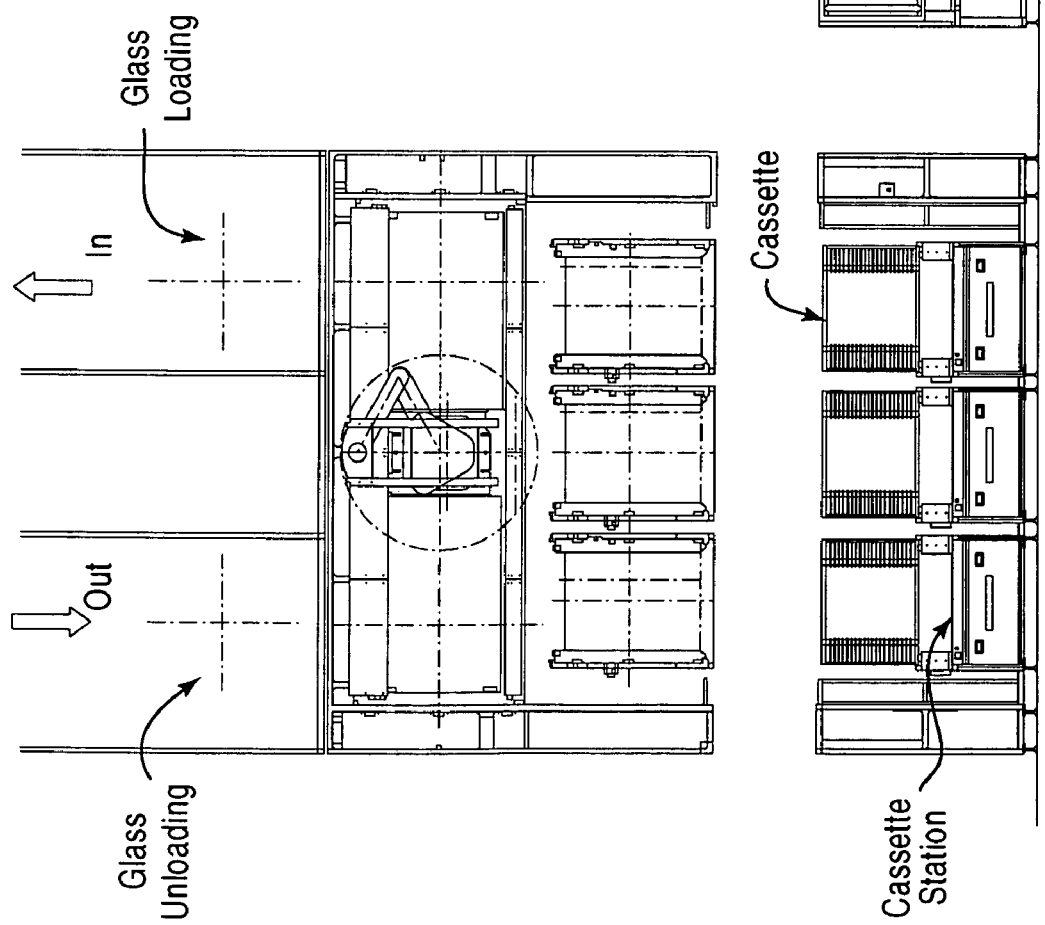
FIG. 8 illustrates cassette station system comprising the substrate transportation device of the present invention.

FIG. 8 illustrates a cassette station system comprising the substrate transportation device of the present invention. In the cassette station system, glass trays, such as a TFT-LCD, are manufactured in a clean room environment. Then the substrates are moved by automated means, such as a robotic arm, from the manufacturing stage to the housing or cassette 10 where they are loaded for storage and transportation. In the housing, the substrates 22 are supported on a cushion of air by jets of air exhausted from the supporting members 8.

Example embodiments of the present invention have now been described in accordance with the above advantages. It will be appreciated that these examples are merely illustrative of the invention. Many variations and modifications will be apparent to those skilled in the art.

We claim:

1. A substrate transportation device comprising:
    a housing having a front opening and a rear opening,
    an array of hollow supporting members disposed within the housing, the hollow supporting members having a plurality of apertures in an upper surface, and a lower surface of each of the hollow supporting members are free from apertures; and
    a medium supply member to supply a medium to the hollow supporting member,
    wherein the medium supplied by the medium supply member is exhausted through the apertures to create a space between the hollow supporting members and a substrate.

2. The substrate transportation device according to claim 1, wherein the medium is exhausted from the hollow supporting members at a pressure greater than ambient pressure.

3. The substrate transportation device according to claim 1, wherein the array of hollow supporting members is arranged to exhaust a medium to support a single substrate.

4. The substrate transportation device according to claim 1, wherein the housing includes a pair of opposing sidewalls and the hollow supporting members extend between the opposing sidewalls.

5. The substrate transportation device according to claim 4, wherein the hollow supporting members are arrayed in rows between the opposing sidewalls.

6. The substrate transportation device according to claim 4, wherein each of the opposing sidewalls comprises a plurality of columns.

7. The substrate transportation device according to claim 1, wherein the medium supply member comprises a multi-fingered blower selectively moveable in the horizontal and vertical directions.

8. The substrate transportation device according to claim 1, wherein the hollow supporting members at the rear opening of the housing are higher than the hollow supporting members at the front opening of the housing, wherein the plurality of substrates in the housing is inclined toward the front opening of the housing.

9. The substrate transportation device according to claim 1, wherein the supporting members are tubular in shape.

10. The substrate transportation device according to claim 1, wherein the medium supply member comprises a compressor for compressing a medium and transferring the compressed medium toward the hollow supporting member.

11. The substrate transportation device according to claim 1, wherein the medium supply member comprises a blower including a blowing fan and a driving motor.

12. The substrate transportation device according to claim 1, further comprising a control unit for outputting control signals to the air-blower, thereby controlling the pressure of the medium supplied to the hollow supporting members.

13. The substrate transportation device according to claim 1, wherein the substrate comprises a glass tray.

14. A method of transporting a substrate into and out of a housing, the method comprising:
    providing a housing including an upper surface, a lower surface, opposing sidewalls, a front opening, a rear opening, and a plurality of hollow supporting members;
    injecting a medium into the plurality of hollow supporting members, the hollow supporting members including a plurality of apertures on an upper surface thereof to exhaust the medium;
    inserting a substrate, by a first edge of the substrate, into the housing substantially parallel to the upper surface of the plurality of hollow supporting members, so that the exhausted medium strikes the lower surface of the substrate floating the substrate; and
    transporting the substrate from the housing.

15. The method according to claim 14, wherein the step of injecting comprises injecting a compressed medium.

16. The method according to claim 15, wherein the step of injecting comprises setting a pressure of the compressed medium to a predetermined pressure.

17. The method according to claim 14, wherein the step of injecting comprises injecting air from a blower.

18. The method according to claim 14, further comprising the step of controlling the pressure of the medium to maintain the substrate at a predetermined distance from the plurality of hollow supporting members.

19. The method according to claim 14, wherein the step of transporting the substrate from the housing comprises transporting the substrate with a small motor.

20. The method according to claim 14, wherein the step of transporting the substrate from the housing comprises transporting the substrate with a metallic reed.

21. The method according to claim 14, wherein the step of transporting the substrate from the housing comprises applying a longitudinal force to a second edge of the substrate.

22. The method according to claim 14, wherein the step of inserting comprises simultaneously inserting a plurality of substrates into the housing.

23. The method according to claim 14, wherein the step of transporting comprises simultaneously discharging a plurality of substrates from the housing.

24. The method according to claim 15, wherein the step of injecting a compressed medium comprises injecting a compressed gas.

25. The method according to claim 24, wherein the step of injecting a compressed gas comprises injecting compressed air.

* * * * *